United States Patent [19]

Suzuki et al.

[11] Patent Number: 5,132,386

[45] Date of Patent: Jul. 21, 1992

[54] INSULATING RESIN COMPOSITION AND SEMICONDUCTOR DEVICE USING THE SAME

[75] Inventors: Hiroshi Suzuki; Shunichiro Uchimura, both of Hitachi, Japan; Hidetaka Sato, Santa Clara, Calif.

[73] Assignee: Hitachi Chemical Co., Ltd., Tokyo, Japan

[21] Appl. No.: 348,151

[22] Filed: May 2, 1989

Related U.S. Application Data

[63] Continuation of Ser. No. 69,761, Jul. 6, 1987, abandoned.

Foreign Application Priority Data

Jul. 4, 1986 [JP] Japan .................. 61-158554

[51] Int. Cl.$^5$ .................................. C08G 77/26
[52] U.S. Cl. ........................... 528/26; 528/28; 528/38
[58] Field of Search .............. 528/26, 353, 38, 28

[56] References Cited

U.S. PATENT DOCUMENTS

| | | | |
|---|---|---|---|
| 3,338,859 | 8/1967 | Green | 525/474 |
| 3,492,270 | 1/1970 | Parish | 528/26 |
| 3,740,305 | 6/1973 | Hoback et al. | 528/26 |
| 4,030,948 | 6/1977 | Berger | 528/26 |
| 4,051,163 | 9/1977 | Berger | 528/26 |
| 4,299,750 | 10/1981 | Antonoplos et al. | 528/353 |
| 4,332,708 | 6/1982 | Boldebuck et al. | 528/353 |
| 4,467,000 | 8/1984 | Economy et al. | 528/353 |
| 4,485,140 | 11/1984 | Gannett et al. | 528/353 |
| 4,499,042 | 2/1985 | Ishizuka et al. | 528/353 |
| 4,520,075 | 5/1985 | Igarashi et al. | 528/353 |
| 4,524,171 | 6/1985 | Bakshi et al. | 528/353 |
| 4,535,099 | 8/1985 | Lee et al. | 528/26 |
| 4,535,115 | 8/1985 | Bakshi et al. | 528/357 |
| 4,689,391 | 8/1987 | Peters et al. | 528/353 |
| 4,748,228 | 5/1988 | Shoji et al. | 528/26 |

*Primary Examiner*—John C. Bleutge
*Assistant Examiner*—R. Dean, Sr.
*Attorney, Agent, or Firm*—Fay, Sharpe, Beall, Fagan, Minnich & McKee

[57] ABSTRACT

Insulating resin composition for a semiconductor device having a multilevel interconnection layers formed by the resin and having a superior planarizing capability relative to a lower interconnection layer is provided, which resin being a cured product of a polyamic acid ester oligomer obtained by reacting an aromatic diamine and/or a diaminosiloxane with an aromatic tetracarboxylic acid ester obtained by reacting an aromatic tetracarboxylic acid dianhydride with an alcohol or alcohol derivative.

9 Claims, 2 Drawing Sheets

INSULATING RESIN COMPOSITION AND SEMICONDUCTOR DEVICE USING THE SAME

This is a continuation of co-pending application Ser. No. 07/069,761 filed on Jul. 6, 1987, now abandoned.

BACKGROUND OF THE INVENTION

This invention relates to an insulating resin composition and semiconductor device using the same, and more particularly it relates to a semiconductor device having a multi-level interconnection suitable for high integration.

Heretofore, in the production of a semiconductor device having a multilevel interconnection composed mainly of a two-level interconnection, a first level interconnection layer is at first formed on the base of the semiconductor, followed by forming an insulating film thereon, then forming a through-hole at a predetermined part of the insulating film according to a known hot etching process to expose a portion of the first level interconnection layer, then forming a metal film which is to constitute a second level interconnection layer according to vacuum deposition or spattering method and further subjecting this film to hot etching to form the second level interconnection layer. At that time, a metal film composed mainly of aluminum has most often been used as the interconnection layers, and an inorganic insulating film composed mainly of $SiO_2$ film or an organic resin insulating film of polyimide group resins has been used as the insulating film material.

Since the interconnection layer is composed mainly of aluminum, it is necessary for preventing fusion of aluminum and running-through of fused aluminum into the joint of the semiconductor to restrict the temperature at which the insulating film is formed on the interconnection layer to 450° C. or lower. Thus, the inorganic insulating film such as those of $SiO_2$, silicon carbide, etc. should be formed at a relatively low temperature such as about 400° C. according to chemical gas phase growth method, high frequency spattering method or the like. However, such methods have had the following drawbacks. According to the chemical gas phase growth method, $SiO_2$ film formed is liable to cause cracks. So that a film having a thickness of at most only 1 μm or less can be formed. Further according to the spattering method, the resulting inorganic insulating film has a low formation rate.

Further the inorganic insulating film have had the following drawbacks. Since the film is formed faithfully reproducing the projections and depressions (step differences) of the lower interconnection layer as it is, it has an inferior step-covering ability and the upper interconnection layer is liable to cause disconnection on the lateral side of the step so that it is deficient in reliability.

In order to overcome such drawbacks of the inorganic insulating film, a process has been carried out wherein an organic resin film of polyimide group resin including polyimide having fluidity and a superior step-covering ability is formed as an insulating film on a interconnection layer to planarize the projections and depressions on the lower interconnection layer and thereby dissolve the problem of the step difference. As materials for such polyimide (a cured product of a polyamic acid polymer obtained by reacting an aromatic diamine with an aromatic tetracarboxylic acid dianhydride) or polyimide group resin (e.g. a cured product of a polyamic acid polymer obtained by reacting an aromatic diamine, an aromatic tetracarboxylic acid dianhydride and an aromatic diaminocarbonic amide), for example, PIQ varnish (trademark of a product manufactured by Hitachi Chemical Company, Ltd.), etc. are used. This PIQ varnish is rotation-applied onto a lower interconnection layer, followed by volatizing the solvent component and then heating the resulting material to 200° to 400° C. to form a cured film of PIQ. This varnish have been usually adjusted to a resin content of 10 to 20% by weight and a viscosity of 5 to 50 poises.

As shown in FIG. 1, when the thickness of an interconnection layer 3 formed on a semiconductor base 1 is denoted as ta and the thickness of a step-covering part remained after formation of an organic resin insulating film 4 is denoted as tb, the value of $$\left(1 - \frac{tb}{ta}\right)$$

will be defined as a step-covering performance or a planarizing capability. The planarizing capability in the case where the polyimide or polyimide group resin is used is in the range of 0.15 to 0.4.

When an organic resin insulating film is formed and thereafter a through-hole is formed at a predetermined part of the resin insulating film in order to connect the lower interconnection layer and the upper interconnection layer, a wet etching process using a basic etching solution containing hydrazine is employed. Since this wet etching process is an isotropic etching which proceeds at the same rate in both the longitudinal direction and the lateral direction, there is practically no problem for the present with the polyimide or polyimide group resin having a planarizing capability of 0.15 to 0.4. However, there is still a difference in the film thickness between on the plane part and on the step-covering part, and further in the wet etching process, a proper etching time is different on the plane part and on the step-covering part, respectively. That is, the film thickness on the step-covering part is smaller than that of the plane part, so that when the etching on the plane part has reached a proper state, over-etching occurs on the step-covering part. Thus, the etching accuracy becomes inferior and hence when the polyimide or polyimide group resin is used as the insulating film material, a through-hole of 5 μm square has been a practical limit.

On the other hand, accompanying a tendency of high integration of semiconductor devices, an interconnection of the device has been made finer year after year. Accordingly, for effecting patterning of the interconnection layer and opening the resin insulating film, a wet etching process has been changed to a dry etching process such as plasma or reaction type ion etching process on the like, which makes fine etching possible. For carrying out etching for a fine through-hole of 2 μm or less according to these dry etching processes, it is necessary to expose a photoresist so as to give a high resolution, and it is preferred to planarize the step as much as possible which is caused by covering a lower interconnection layer with an organic resin insulating film. For this purpose, it is required to retain the thickness of the resulting film of conventional polyimide or polyimide group resins to the same extent, raise the content of the resin in order to enhance the step-covering capability and reduce the viscosity (or molecular weight).

However, conventional polyimide or polyimide group resins of polyamic acid polymer type have limit to elevation of the content of resin and reduction of the viscosity. Hence when conventional polyimide or polyimide group resins are formed on the interconnection layer, followed by etching the resin insulating film according to dry etching, the resulting etching accuracy is inferior; thus it has been difficult to obtain a semiconductor device having a more highly integrated multilevel interconnection structure.

SUMMARY OF THE INVENTION

The object of the present invention is to provide an insulating resin composition and a semiconductor device using the same having overcome the above-mentioned drawbacks of the prior art, and having a superior step-covering capability to the interconnection layer and a superior fine etching performance in dry etching process.

The present inventors have found that when a cured product of a polyamic acid ester oligomer is used as an insulating film material for a semiconductor device having multilevel interconnecting structure, the step-covering part of the lower interconnection layer is planarized, whereby there is no fear of disconnection drawback on the side surface of the step between the upper interconnection layer and the lower interconnection layer, and etching for the through-hole of fine insulating film becomes possible; thus it is possible to obtain a semiconductor device having multilevel interconnecting structure with a fine interconnection and a fine through-hole, suitable to high integration and having a high reliability.

The present invention is directed to an insulating resin composition for semiconductor devices comprising a cured product of a polyamic acid ester oligomer obtained by reacting at least one member selected from the group consisting of aromatic diamines and diaminosiloxanes with an aromatic tetracarboxylic acid ester obtained by reacting an aromatic tetracarboxylic acid dianhydride with at least one member selected from the group consisting of alcohols and alcohol derivatives.

DETAILED DESCRIPTION OF PREFERRED EMBODIMENTS

Figure 1:
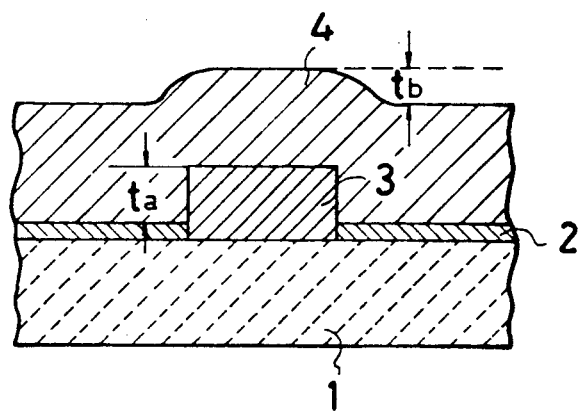
FIG. 1 shows a shematic cross-sectional view of a semiconductor device for explaining planarizing capability.

The polyamic acid ester oligomer used as an insulating film material on a interconnection layer in the present invention is obtained by reacting an aromatic tetracarboxylic acid ester obtained by reacting an aromatic tetracarboxylic acid dianhydride with at least one member selected from alcohols and alcohol derivatives if necessary in the presence of a solvent, with at least one member selected from aromatic diamines and diaminosiloxanes preferably in a nearly equimolar amount to the aromatic tetracarboxylic acid ester. Examples of the solvent used at that time are ether-glycol solvents such as butyl-cellosolve, N-methyl-2-pyrrolidone, N,N-diethylformamide, dimethylsulfoxide, etc. They are used alone or in an admixture of two kinds or more thereof.

The aromatic tetracarboxylic acid dianhydride is expressed by the formula:

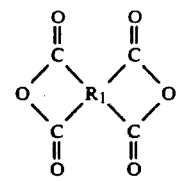

wherein $R_1$ represents a tetravalent aromatic hydrocarbon radical. Examples thereof are 3,3',4,4'-benzophenonetetracarboxylic acid dianhydride, pyromellitic acid dianhydride, 3,3',4,4'-diphenyltetracarboxylic acid dianhydride, 1,2,5,6-naphthalenetetracarboxylic acid dianhydride, 2,3,6,7-naphthalenetetracarboxylic acid dianhydride, 2,3,5,6-pyridinetetracarboxylic acid dianhydride, 1,4,5,8-naphthalenetetracarboxylic acid dianhydride, 3,4,9,10-perylenetetracarboxylic acid dianhydride, 4,4'-sulfonyldiphthalic acid dianhydride, etc. They are used alone or in an admixture of two kinds or more thereof.

Examples of the alcohols or alcohol derivatives for esterifying the aromatic tetracarboxylic acid dianhydride are monohydric alcohols such as methanol, ethanol, propanol, isopropyl alcohol, butanol, etc., polyols such as ethylene glycol, propylene glycol, glycerine, trimethylpropane, etc., and as the alcohol derivatives, cellosolves, carbitols, etc.

The aromatic diamines used in the present invention are expressed by the formula:

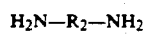

wherein $R_2$ represents a divalent aromatic hydrocarbon radical. Examples thereof are 4,4'-diaminodiphenyl ether, 4,4'-diaminodiphenylmethane, 4,4'-diaminodiphenyl sulfone, 4,4'-diaminodiphenyl sulfide, benzidine, metaphenylenediamine, paraphenylenediamine, 1,5-naphthalenediamine, 2,6-naphthalenediamine, etc. These are used alone or in an admixture of two kinds or more thereof.

The diaminosiloxanes used in the present invention are expressed by the formula:

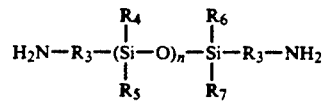

wherein $R_3$ represents a divalent hydrocarbon radical of 1 to 10 carbon atoms; $R_4$, $R_5$, $R_6$ and $R_7$ each represent a monovalent hydrocarbon radical of 1 to 10 carbon atoms and may be the same or different kinds; and n represents an integer of 1 to 10. For example, compounds expressed by the following formulas are preferably used, and these are used alone or in an admixture of two kinds or more thereof:

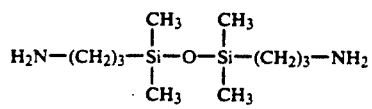

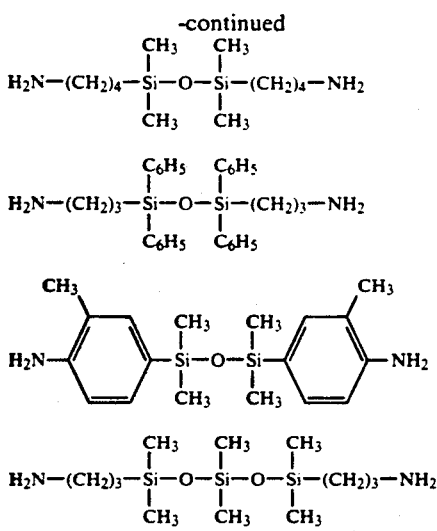

The aromatic diamines and diaminosiloxanes may be used in combination.

Esterification of the aromatic tetracarboxylic acid dianhydrides in the present invention is carried out using an alcohol and/or an alcohol derivative in an equimolar amount or more relative to the aromatic tetracarboxylic acid dianhydrides. The reaction temperature varies depending on the solvent, alcohols and alcohol derivatives used and has no particular limitation, but for example when 3,3',4,4'-benzophenonetetracarboxylic acid dianhydride is reacted with ethanol in N-methyl-2-pyrrolidone for esterification, temperatures of 80° to 150° C. are preferred. Further, in order to adjust the concentration after the esterification, an excess alcohol or alcohol derivative can be removed, but in this case, it is preferred to heat the alcohol or alcohol derivative to its boiling point or higher.

As to the reaction of the aromatic tetracarboxylic acid ester with the aromatic diamine and/or the diaminosiloxane, in order to make the heat resistance of the resulting cured product highest, it is preferred to react the aromatic tetracarboxylic acid with the aromatic diamine and/or the aminosiloxane in nearly equimolar amounts. Further, as to the reaction of the aromatic tetracarboxylic acid ester with the aromatic diamine and/or the diaminosiloxane, if the reaction temperature is too high, the resulting polyamic acid ester oligomer is converted into an imide so that its solubility lowers and it is deposited; hence it is preferred to carry out the reaction at a reaction temperature up to 90° C. at the highest.

When the thus produced polyamic acid ester is heat-treated at a temperature of 200° C. to 400° C., preferably 250° to 350° C., a polyimide resin having a superior heat resistance is obtained.

Since the concentration of the resin content in the polyamic acid ester oligomer can be varied within a range of 40 to 60% by weight and also the viscosity thereof can be varied within a range of 0.5 to 50 poises, it is possible to determine a proper content of resin and a viscosity in accordance with the thickness of the lower interconnection layer. The molecular weight of the oligomer is in the range of 500 to 20000, preferably 1000 to 10000.

The above polyamic acid ester oligomer is applied onto a interconnection layer with a spinner or the like, followed by drying the resulting material at a temperature of 100° to 200° C., preferably 120° to 180° C., for preferably 1 to 2 hours and then curing the resulting material at a temperature of 300° to 400° C., preferably 320° to 380° C. for preferably 1 to 2 hours, whereby an organic resin insulating film is formed.

Next, production of the semiconductor device of the present invention will be described in more detail by way of an embodiment referring to the accompanying drawings.

FIGS. 2-6 show schematic cross-sectional views illustrating steps for producing a semiconductor device of the present invention, where on a first interconnection layer 14 are formed an insulating film 15 and a second interconnection layer 18.

Figure 2:
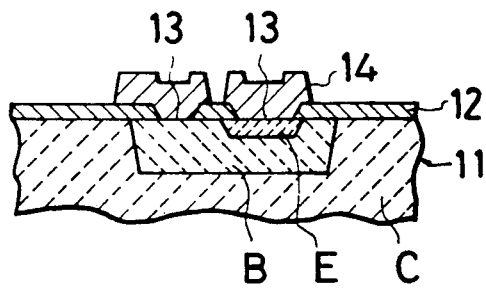
FIGS. 2-6 show schematic cross-sectional view illustrating steps for producing a semiconductor device of the present invention, where on a first interconnection layer 14 are formed an insulating film 15 and a second interconnection layer 18.

In the production of the semiconductor device of the present invention, as shown in FIG. 2, for example a silicon dioxide film 12 is first formed on the surface of a semiconductor base 11 consisting of a collector region C, a base region B and an emitter region E according to a chemical gas-phase growth method. Next, a definite portion which will constitute a portion connecting a lead terminal is removed by a photoetching method and a through-hole (window) 13 is provided in the silicon dioxide film 12 to expose the respective portions of the emitter region E and the base region B. Furhter, an aluminum layer is formed on the through-hole 13 according to vacuum deposition or spattering method, and a first interconnection layer 14 is formed by a photoetching method. This interconnection layer had a thickness of 1 μm and a width of 2 to 5 μm.

Next, with a polyamic acid ester oligomer, an insulating film 15 consisting of a cured product of the oligomer was formed. The polyamic acid ester oligomer used above was prepared by adding, 3,3',4,4'-benzophenonetetracarboxylic acid dianhydride (161.1 g) and pyromellitic acid dianhydride (109.1 g) to N,N-diethylformamide (700 g), heating the mixture up to 80° C. to dissolve it, adding ethanol (80 g), reacting the mixture at 120° C. for 3 hours, removing excess alcohol, cooling the resulting solution down to 80° C., adding to the solution. 4,4'-diaminodiphenyl ether (190 g) and 1,3-bis-(aminopropyl)tetramethyldisiloxane (12.4 g) and reacting the mixture at 80° C. for 3 hours. The resulting polyamic acid ester oligomer solution was heat-treated at 200° C. for 2 hours to prepare an oligomer solution having a content of resin of 40% by weight and a viscosity of 2 poises at 25° C.

Figure 3:
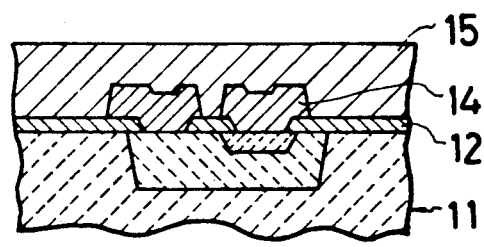

The thus prepared oligomer solution was applied for 30 seconds by means of a spinner so as to give a thickness of 3,000 μm and then subjected to heat curing treatment at 100° C. for one hour, further at 200° C. for one hour and still further at 350° C. for one hour to form a film of a cured product of the above oligomer 15, as shown in FIG. 3. The thickness of the resulting resin film was 2.0 μm at the plane part on the silicon dioxide film 12 without the interconnection layer 14, the thickness of the resin film formed on the interconnection layer 14 was 1 μm and the planarizing capability was in the range of 0.85 to 0.90. This indicates that the above planarizing capability has been much more improved as compared with the case where the resin film prepared by using conventional polyimide resin or polyimide group resins has a planarizing capability of 0.15 to 0.4, and the projections and depressions formed by the through-hole 13 and the first interconnection layer 14 has been planarized to almost dissolve the step difference.

Figure 4:
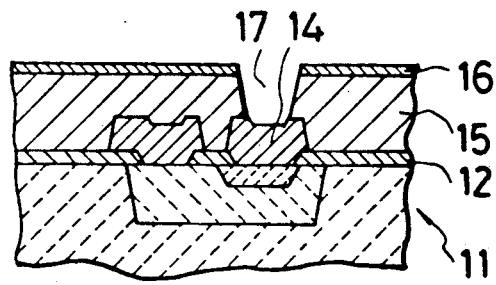
Figure 5:
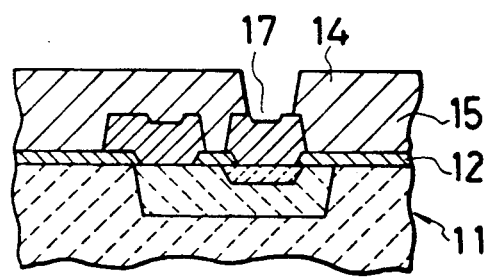

Next, as shown in FIG. 4, chrome was vacuum-deposited on the film of the cured product 15 to prepare a chrome-vacuum-deposited film 16, followed by removing a predetermined portion of the chrome-vacuum-deposited film 16 i.e. a portion at which it was to be electrically connected with the first interconnection layer 14 according to photoetching method by the use of a novolak photosensitive resin to form an etching mask for forming a through-hole of 2 to 5 μm square, further removing the chrome-vacuum-deposited film 16 by means of oxygen gas under conditions of a pressure of 5 mm Torr, a power of 100 W and an oxygen gas flow amount of 10 SCCM by the use of a reactive ion etching apparatus (CSE 2120, tradename of apparatus manufactured by Japan vacuum Technique Co., Ltd.), removing the exposed film of the cured product 15 by selective anisotropical etching to form a through-hole (window) 17 where the predetermined portion of the first interconnection layer 14 was exposed, and thereafter removing the remaining chrome-vacuum-deposited film 16 by means of e.g. a chrome etching solution consisting of an aqueous solution of cerium nitrate ammonium, etc. without corroding the layer film of cured product, the silicon dioxide film and the aluminum interconnection layer, as shown in FIG. 5. The thus obtained through-hole (window) 17 of the cured product film 15 had a tapered angle of 65° to 70° and also had through-hole dimensions of 2 μm square at the etching mask part of 2 μm square and 5 μm; thus the through-hole was formed with a very good accuracy, just in accordance with the designed dimensions of the etching mask, without depending on the dimensions of the through-hole.

Figure 6:
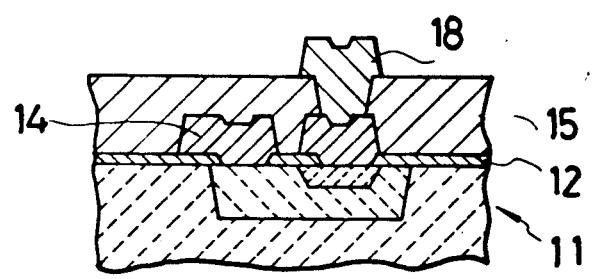

As described above, the film of the cured product obtained from the polyamic acid ester oligomer had a far superior planarizing capability and as shown in FIG. 6, when a through-hole is formed in the resin film 15 for electrically connecting the first interconnection layer 14 with the second interconnection layer 18, it is possible to form the chrome-vacuum-deposited film 16 for the etching mask very uniformly and planarly. As a result, a photoresist of novolak resin or the like is formed on the chrome-vacuum-deposited film uniformly and planarly and exposure is carried out uniformly; hence it is possible to form a fine pattern in a state of making use of the resolution of the photoresist so that it is possible to form a through-hole etching mask of fine 2 μm square of the resin film with a good accuracy. Still further, when a photoresist having a high resolution is used, it is possible to carry out through-hole etching of 2 μm or less.

Next, as shown in FIG. 6, a second interconnection layer 18 is formed according to aluminum-vacuum deposition or spattering and photoetching, followed by forming a film of a cured product on the second interconnection layer 18 using a polyamic acid ester oligomer and then forming a through-hole on the resin film by through-hole etching method. By repeating these steps, a semiconductor device of a multilevel interconnecting structure according to the present invention is obtained. And by selecting the content of the resin, the viscosity and the thicknesses of the interconnection layers, it is possible to form resin films having a good planarizing capability.

The semiconductor device of the present invention uses the above-mentioned polyamic acid ester oligomer as the insulating film material on the interconnection layer, and has a multilevel interconnecting structure having a superior step coating (planarizing capability) relative to the interconnection layer and also a superior fine through-hole etching capability according to dry etching method, having fine interconnection, and fine through-holes, being suitable to high integrate ion and having a high reliability.

The semiconductor device of the present invention is suitable as a semiconductor device for hybrid IC, monolithic IC, LSI, etc.

What we claim is:

1. An insulating resin composition for semiconductor devices comprising a cured product of a polyamic acid ester oligomer obtained by reacting at least one member selected from the group consisting of diaminosiloxanes and aromatic diamines having no siloxane bonds and mixtures of aromatic diamines having no siloxane bond, said diamine comprising:

at least one member selected from the group consisting of 4,4'-diaminodiphenyl ether, 4,4'-diaminodiphenylmethane, 4,4'-diaminodiphenyl sulfone, 4,4'-diaminodiphenyl sulfide, benzidine, metaphenylenediamine, paraphenylenediamine, 1,5-naphthalenediamine and 2,6-naphthalenediamine; with an aromatic tetracarboxylic acid ester obtained by reacting an aromatic tetracarboxylic acid dianhydride with at least one member selected from the group consisting of monohydric alcohols, polyols, cellosolves, and carbitols in an anhydrous solvent, the aromatic tetracarboxylic acid dianhydride having the general structure:

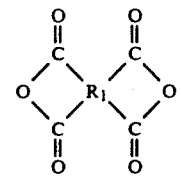

wherein $R_1$ represents a tetravalent aromatic group.

2. An insulating resin composition according to claim 1 wherein said aromatic tetracarboxylic acid dianhydride expressed by said formula is at least one member selected from the group consisting of 3,3',4,4'-benzophenonetetracarboxylic acid dianhydride, pyromellitic acid dianhydride, 3,3',4,4'-diphenyltetracarboxylic acid dianhydride, cyclopentanetetracarboxylic acid dianhydride, 1,2,5,6-naphthalenetetracarboxylic acid dianhydride, 2,3,6,7-naphthalenetetracarboxylic acid dianhydride, 2,3,5,6-pyridinetetracarboxylic acid dianhydride, 1,4,5,8-naphthalenetetracarboxylic acid dianhydride, 3,4,9,10-perylenetetracarboxylic acid dianhydride and 4,4'-sulfonyldiphthalic acid dianhydride, 3. An insulating resin composition according to claim 1 wherein said monohydric alcohols, polyols, cellosolves and carbitols are at least one member selected from the group of monohydric alcohols represented by methanol, ethanol, propanol, isopropyl alcohol and butanol, polyols represented by ethylene glycol, propylene glycol, glycerine and trimethylolpropane, cellosolves and carbitols.

4. An insulating resin composition according to claim 1 wherein said diaminosiloxanes are compounds expressed by the formula

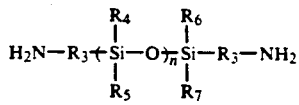

wherein $R_3$ represents a divalent hydrocarbon group having 1 to 10 carbon atoms; $R_4$, $R_5$, $R_6$ and $R_7$ each represent a monovalent hydrocarbon group of 1 to 10 carbon atoms and may be the same or different; and $\eta$ represents an integer of 1 to 10.

5. An insulating resin composition according to claim 4 wherein said diaminosiloxanes expressed by said formula are at least one member selected from the group consisting of

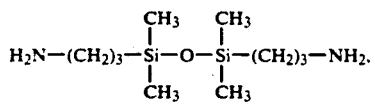

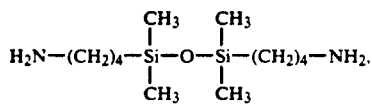

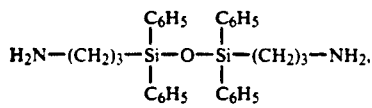

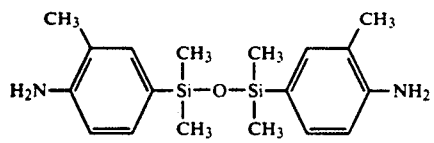

and

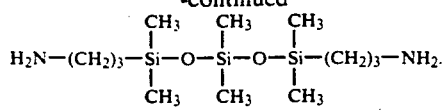

6. An insulating resin composition according to claim 1 wherein the esterification of said aromatic tetracarboxylic acid dianhydride is carried out using at least one member selected from the group consisting of monohydric alcohols, polyols, cellosolves and carbitols in an equimolar amount or more based on said aromatic tetracarboxylic acid dianhydride at a temperature of 80° to 150° C.

7. An insulating resin composition according to claim 1 wherein the reaction of said aromatic tetracarboxylic acid ester with at least one member selected from the group consisting of aromatic diamines and diaminosiloxanes is carried out in nearly equimolar quantities of the former ester and the latter at least one member at a temperature of 90° C. or lower.

8. An insulating resin composition according to claim 1 wherein said polyamic acid ester oligomer is heat-treated at a temperature of 200° to 400° C. and then adjusted so as to have a content of resin of 40 to 60% by weight and a viscosity of 0.5 to 50 poises at 25° C.

9. A method for producing a cured polyamic acid ester oligomer, the method comprising:
providing an anhydrous solvent;
adding an aromatic tetracarboxylic acid dianhydride to the solvent to form a solvent-dianhydride mixture;
heating the solvent-dianhydride mixture to dissolve the dianhydride;
adding an alcohol or alcohol derivative to the solvent-dianhydride mixture;
reacting the mixture at a temperature between about 80° C. and about 150° C.;
cooling the mixture;
reacting at least one member selected from the group consisting of aromatic diamine having no siloxane bonds and mixtures of aromatic diamines having no siloxane bond and diaminosiloxane to the mixture to form a polyamic acid ester oligomer solution; and,
curing the polyamic acid ester oligomer.

* * * * *